(12) United States Patent
Zhou et al.

(10) Patent No.: US 9,772,360 B2
(45) Date of Patent: Sep. 26, 2017

(54) DETECTING DEVICE AND DETECTING METHOD FOR DETECTING OUTPUT IMPEDANCE ANGLE OF INVERTER

(71) Applicant: DELTA ELECTRONICS, INC., Taoyuan (TW)

(72) Inventors: Jian-Hong Zhou, Taoyuan (TW); Cheng Lu, Taoyuan (TW); Jia-Min Zhang, Taoyuan (TW); Hong-Yang Wu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 65 days.

(21) Appl. No.: 15/084,492

(22) Filed: Mar. 30, 2016

(65) Prior Publication Data

US 2016/0349298 A1 Dec. 1, 2016

(30) Foreign Application Priority Data

May 26, 2015 (CN) .......................... 2015 1 0274064

(51) Int. Cl.
*G01R 27/28* (2006.01)
*G01R 27/26* (2006.01)
(Continued)

(52) U.S. Cl.
CPC ............. *G01R 27/26* (2013.01); *G01R 27/06* (2013.01); *G01R 27/28* (2013.01);
(Continued)

(58) Field of Classification Search
CPC .... G01R 31/3183; G01R 27/06; G01R 27/28; G01R 31/00; G01R 27/00
(Continued)

(56) References Cited

U.S. PATENT DOCUMENTS 4,703,193 A 10/1987 Kawabata
5,349,522 A * 9/1994 Konishi ................ H02J 3/1842
323/205
(Continued)

FOREIGN PATENT DOCUMENTS

CN 104011959 A 8/2014
EP 1870993 A1 12/2007
(Continued)

*Primary Examiner* — Jermele M Hollington
*Assistant Examiner* — Raul Rios Russo
(74) *Attorney, Agent, or Firm* — CKC & Partners Co., Ltd.

(57) ABSTRACT

A detecting method for detecting an output impedance angle of an inverter includes controlling an inverter to output a second voltage signal and a current signal based on a first voltage signal; calculating an active power and reactive power based on the second voltage signal and the current signal; and calculating an output impedance angle of the inverter based on the product of the active power and a first amplitude parameter, the product of the active power and a second amplitude parameter, the product of the reactive power and the first amplitude parameter, and the product of the reactive power and the second amplitude parameter. The first amplitude parameter corresponds to a first amplitude of the first voltage signal, and the second amplitude parameter corresponds to the first amplitude of the first voltage signal and a second amplitude of an AC voltage.

27 Claims, 11 Drawing Sheets

(51) Int. Cl.
  *G01R 31/3183* (2006.01)
  *G01R 27/06* (2006.01)
  *H02M 7/5387* (2007.01)
  *H02M 7/44* (2006.01)
  *H02M 1/00* (2006.01)
(52) U.S. Cl.
  CPC .......... *G01R 31/3183* (2013.01); *H02M 7/44* (2013.01); *H02M 7/5387* (2013.01); *H02M 2001/0003* (2013.01)
(58) Field of Classification Search
  USPC .......... 324/76.11–76.83, 459, 600, 615, 638, 324/650; 363/40, 71, 95, 98, 105, 205, 363/212
  See application file for complete search history.

(56) References Cited

U.S. PATENT DOCUMENTS

| | | | | |
|---|---|---|---|---|
| 5,351,181 A | * | 9/1994 | Brennen | ............... H02J 3/1842 307/105 |
| 2016/0134201 A1 | * | 5/2016 | Lu | ........................... H02M 7/44 363/71 |

FOREIGN PATENT DOCUMENTS

| | | |
|---|---|---|
| JP | 2008125311 A | 5/2008 |
| TW | 242203 B | 3/1995 |

\* cited by examiner

DETECTING DEVICE AND DETECTING METHOD FOR DETECTING OUTPUT IMPEDANCE ANGLE OF INVERTER

RELATED APPLICATIONS

This application claims priority to China Application Serial Number 201510274064.5, filed May 26, 2015, which is herein incorporated by reference.

BACKGROUND

Field of Invention

The present disclosure relates to technology for detecting inverters. More particularly, the present disclosure relates to a detecting device and a detecting method for detecting an output impedance angle of an inverter.

Description of Related Art

Inverters are power converting devices employing power electronics technology. Power can be converted from DC to AC by an inverter utilizing a suitable control method. When an output impedance of an inverter is pure inductive, an active power and a reactive power are decoupled. The active power of the inverter is mainly controlled by the phase of a voltage, and the reactive power of the inverter is mainly controlled by the amplitude of a voltage.

Based on power-transmission principles, a voltage source control type inverter that is grid-connected or a plurality of inverters connected in parallel usually use droop control. However, an output impedance of the inverter usually is inductive and resistive. Particularly when an inverter is connected to a low-voltage power grid, the active power and the reactive power are not decoupled. In this case, if a droop control is used, the coupling among the active power and the reactive power is higher.

If an output impedance angle of an inverter can be obtained and a rotation matrix is employed, the rotated active power and reactive power are decoupled; therefore, a droop control can be used. Hence, to control an inverter efficiently, the foregoing impedance must be obtained. However, there is no method at present which can automatically detect output impedance angles of inverters simply and accurately.

In view of the foregoing, problems and disadvantages are associated with existing products that require further improvement. However, those skilled in the art have yet to find a solution.

SUMMARY

The following presents a simplified summary of the disclosure in order to provide a basic understanding to the reader. This summary is not an extensive overview of the disclosure and it does not identify key/critical elements of the present disclosure or delineate the scope of the present disclosure.

The disclosure provides a detecting device and a detecting method for detecting an output impedance angle of an inverter, which address the problem existing in the prior art.

One aspect of the present disclosure is directed to a detecting method for detecting an output impedance angle of an inverter. The detecting method comprises controlling an inverter to output a second voltage signal and a current signal based on a first voltage signal; calculating an active power and a reactive power based on the second voltage signal and the current signal; and calculating an output impedance angle of the inverter based on a product of the active power and a first amplitude parameter, a product of the active power and a second amplitude parameter, a product of the reactive power and the first amplitude parameter, and a product of the reactive power and the second amplitude parameter, wherein the first amplitude parameter corresponds to a first amplitude of the first voltage signal, and the second amplitude parameter corresponds the first amplitude of the first voltage signal and a second amplitude of an AC voltage.

Another aspect of the present disclosure is directed to a detecting method for detecting an output impedance angle of an inverter. The detecting method comprises controlling an inverter to output a second voltage signal and a current signal based on a first voltage signal, wherein the first voltage signal comprises a first amplitude and a power angle, a value of one of the first amplitude and the power angle is variable, and a value of the other one of the first amplitude and the power angle is constant; calculating a first active power, a second active power, a first reactive power, and a second reactive power based on the second voltage signal and the current signal; and calculating an output impedance angle of the inverter based on a product of the first active power and a first amplitude parameter, a product of the first active power and a second amplitude parameter, a product of the second active power and the first amplitude parameter, and a product of the second active power and the second amplitude parameter, or calculating the output impedance angle of the inverter based on a product of the first reactive power and the first amplitude parameter, a product of the first reactive power and the second amplitude parameter, a product of the second reactive power and the first amplitude parameter, and a product of the second reactive power and the second amplitude parameter, wherein the first amplitude parameter corresponds to the first amplitude of the first voltage signal, and the second amplitude parameter corresponds to the first amplitude of the first voltage signal and a second amplitude of an AC voltage.

Still another aspect of the present disclosure is directed to a detecting device for detecting an output impedance angle of an inverter. The detecting device comprises a control unit, an active power and reactive power calculation unit, and an impedance angle calculation unit. The control unit is configured for controlling an inverter to output a second voltage signal and a current signal based on a first voltage signal. The active power and reactive power calculation unit is configured for calculating an active power and a reactive power based on the second voltage signal and the current signal. The impedance angle calculation unit is configured for calculating an output impedance angle of the inverter based on a product of the active power and a first amplitude parameter, a product of the active power and a second amplitude parameter, a product of the reactive power and the first amplitude parameter, and a product of the reactive power and the second amplitude parameter, wherein the first amplitude parameter corresponds to a first amplitude of the first voltage signal, and the second amplitude parameter corresponds to the first amplitude of the first voltage signal and a second amplitude of an AC voltage.

Yet another aspect of the present disclosure is directed to a detecting device for detecting an output impedance angle of an inverter. The detecting device comprises a control unit, an active power and reactive power calculation unit, and an impedance angle calculation unit. The control unit is configured for controlling an inverter to output a second voltage signal and a current signal based on a first voltage signal, wherein the first voltage signal comprises a first amplitude and a power angle, a value of one of the first amplitude and the power angle is variable, and a value of the other one of the first amplitude and the power angle is constant. The active power and reactive power calculation unit is configured for calculating a first active power, a second active power, a first reactive power, and a second reactive power based on the second voltage signal and the current signal. The impedance angle calculation unit is configured for calculating an output impedance angle of the inverter based on a product of the first active power and a first amplitude parameter, a product of the first active power and a second amplitude parameter, a product of the second active power and the first amplitude parameter, and a product of the second active power and the second amplitude parameter, or calculating the output impedance angle of the inverter based on a product of the first reactive power and the first amplitude parameter, a product of the first reactive power and the second amplitude parameter, a product of the second reactive power and the first amplitude parameter, and a product of the second reactive power and the second amplitude parameter, wherein the first amplitude parameter corresponds to the first amplitude of the first voltage signal, the second amplitude parameter corresponds to the first amplitude of the first voltage signal and a second amplitude of an AC voltage.

In view of the foregoing, embodiments of the present disclosure provide a detecting device and a detecting method for detecting an output impedance angle of an inverter for automatically detecting output impedance angles of inverters simply and accurately, so as to enable efficient control of inverters.

These and other features, aspects, and advantages of the present disclosure, as well as the technical means and embodiments employed by the present disclosure, will become better understood with reference to the following description in connection with the accompanying drawings and appended claims.

BRIEF DESCRIPTION OF THE DRAWINGS

The disclosure can be more fully understood by reading the following detailed description of the embodiment, with reference made to the accompanying drawings as follows.

Figure 1:
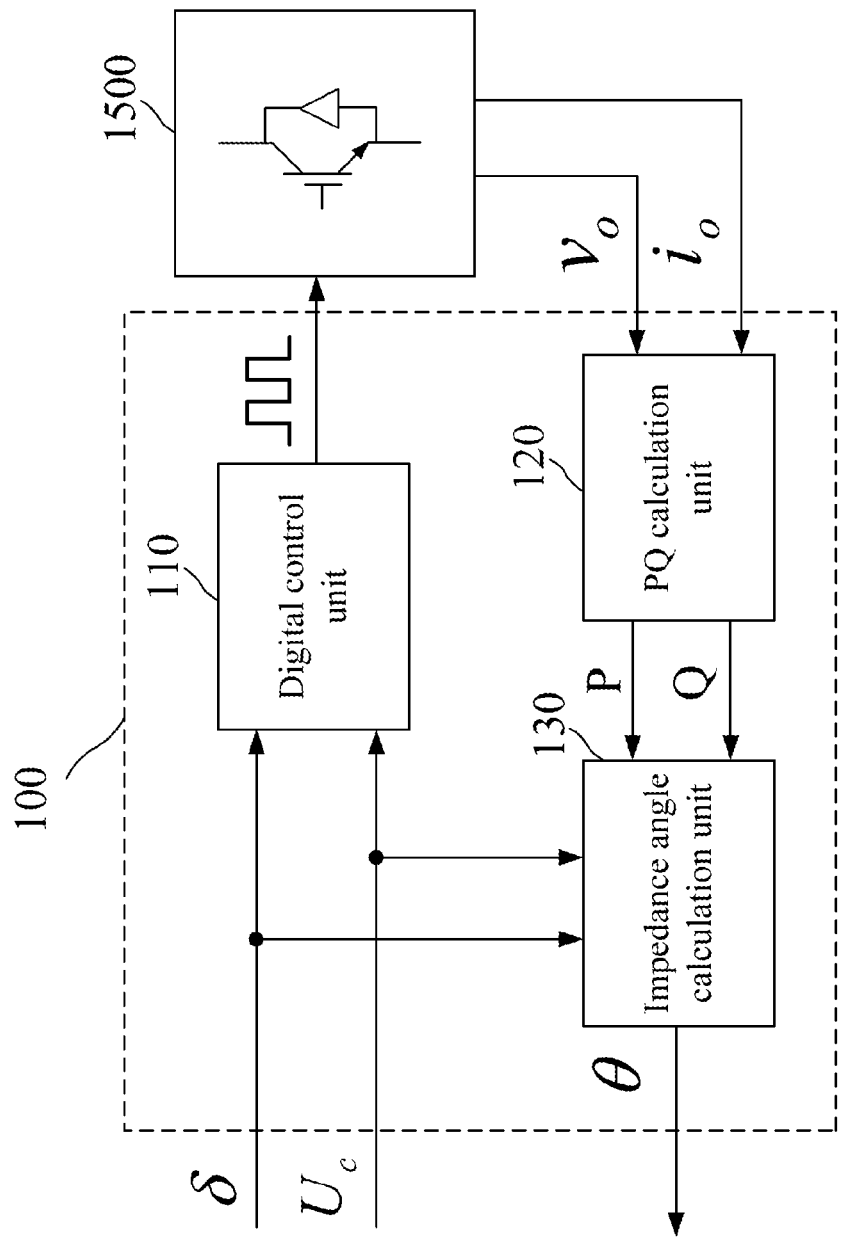
FIG. 1 is a schematic diagram of a detecting device for detecting an output impedance angle of an inverter according to embodiments of the present disclosure.

In accordance with common practice, the various described features/elements are not drawn to scale but instead are drawn to best illustrate specific features/elements relevant to the present disclosure. Also, wherever possible, like or the same reference numerals are used in the drawings and the description to refer to the same or like parts.

DETAILED DESCRIPTION

The detailed description provided below in connection with the appended drawings is intended as a description of the present examples and is not intended to represent the only forms in which the present example may be constructed or utilized. The description sets forth the functions of the examples and the sequence of steps for constructing and operating the examples. However, the same or equivalent functions and sequences may be accomplished by different examples.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include singular forms of the same.

For automatically detecting output impedance angles of inverters simply and accurately so as to enable efficient control of inverters, the present disclosure provides a detecting device and a detecting method for detecting an output impedance angle of an inverter, which will be described below.

FIG. 1 is a schematic diagram of a detecting device for detecting an output impedance angle of an inverter according to embodiments of the present disclosure. As shown in the figure, a detecting device 100 for detecting an output impedance angle of an inverter comprises a digital control unit 110, an active power/reactive power (PQ) calculation unit 120, and an impedance angle calculation unit 130.

Figure 2:
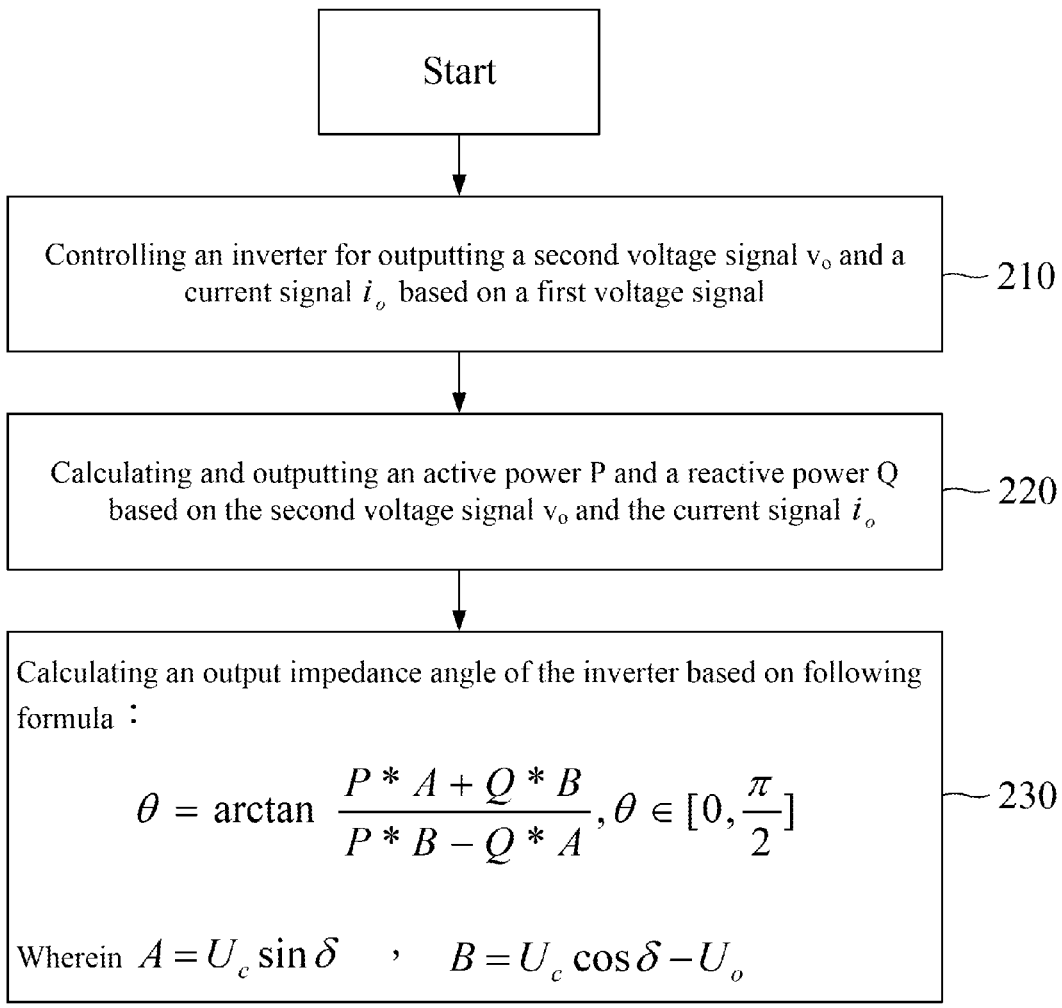
FIG. 2 is a flow diagram illustrating the process steps of a detecting method for detecting an output impedance angle of an inverter according to embodiments of the present disclosure.

For facilitating understanding of operations of the detecting device 100 for detecting an output impedance angle of an inverter of the present disclosure, reference is now made to both FIG. 1 and FIG. 2. FIG. 2 is a flow diagram illustrating the process steps of a detecting method 200 for detecting an output impedance angle of an inverter according to embodiments of the present disclosure. With reference to the figures, in step 210, the digital control unit 110 can be used to control the inverter 1500 for outputting a second voltage signal $v_o$ and a current signal $i_0$ based on a first voltage signal. The first voltage signal comprises a first amplitude $U_c$ and a power angle $\delta$. The power angle $\delta$ can be a phase difference between a first voltage signal and an AC voltage $U_0$, but is not limited thereto. In one embodiment, the AC voltage can be provided from an AC source which is coupled to the detecting device 100 in parallel. For example, the AC source can be a power grid or another inverter. In step 220, the PQ calculation unit 120 can be used to receive the second voltage signal $v_o$ and the current signal $i_0$ and can be used to calculate and output an active power P and a reactive power Q based on the second voltage signal $v_o$ and the current signal $i_0$.

With respect to step 230, first of all, as to calculation logic, the impedance angle calculation unit 130 can be used to calculate an output impedance angle of the inverter 1500 based on a product of the active power P and a first amplitude parameter A, a product of the active power P and a second amplitude parameter B, a product of the reactive power Q and the second amplitude parameter A, and a product of the reactive power Q and the second amplitude parameter B. The first amplitude parameter A corresponds to a first amplitude $U_c$ of the first voltage signal, and the second amplitude parameter B corresponds to the first amplitude $U_c$ and a second amplitude $U_0$ of an AC voltage. In one embodiment, for obtaining an output impedance angle θ accurately, first amplitudes $U_c$ and power angles with multi groups of different parameters can be obtained to calculate output impedance angles θ. For example, first amplitudes $U_c$ and power angles δ with five groups of parameters can be obtained to calculate five output impedance angles θ. Subsequently, an average value of the output impedance angles θ is calculated to obtain a final output impedance angle θ.

Specifically, as shown in step 230, the output impedance angle θ of the inverter 1500 is calculated based on the following formula:

$$\theta = \arctan\frac{P*A + Q*B}{P*B - Q*A} \quad \text{formula 1}$$

In formula 1, θ is the output impedance angle of the inverter, P is the active power, Q is the reactive power, A is the first amplitude parameter, and B is the second amplitude parameter. In addition, the range of the output impedance angle θ of the inverter is from 0 degrees to 90 degrees.

In one embodiment, the first amplitude parameter A and the second amplitude parameter B are respectively obtained by the following formulas:

$$A = U_c \sin \delta \quad \text{formula 2}$$

$$B = U_c \cos \delta - U_o \quad \text{formula 3}$$

In the foregoing formula, A is the first amplitude parameter, B is the second amplitude parameter, $U_c$ is the first amplitude of the first voltage signal, δ is a power angle of the first voltage signal, and $U_0$ is the second amplitude of the AC voltage.

Figure 3:
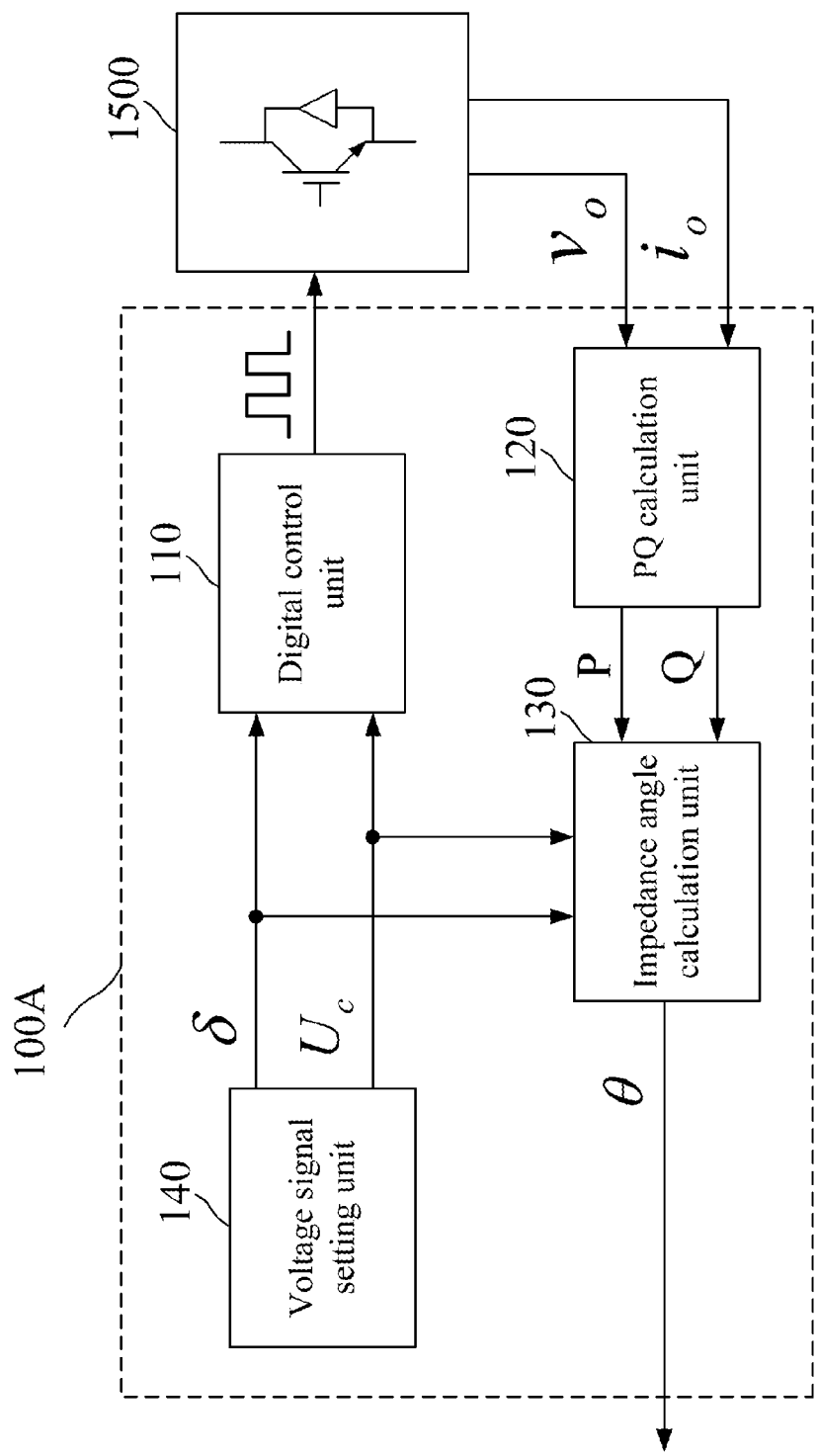
FIG. 3 is a schematic diagram of a detecting device for detecting an output impedance angle of an inverter according to embodiments of the present disclosure.

FIG. 3 is a schematic diagram of a detecting device for detecting an output impedance angle of an inverter according to embodiments of the present disclosure. Compared with the detecting device 100 in FIG. 1, the detecting device 100A herein further comprises a voltage signal setting unit 140.

Figure 4:
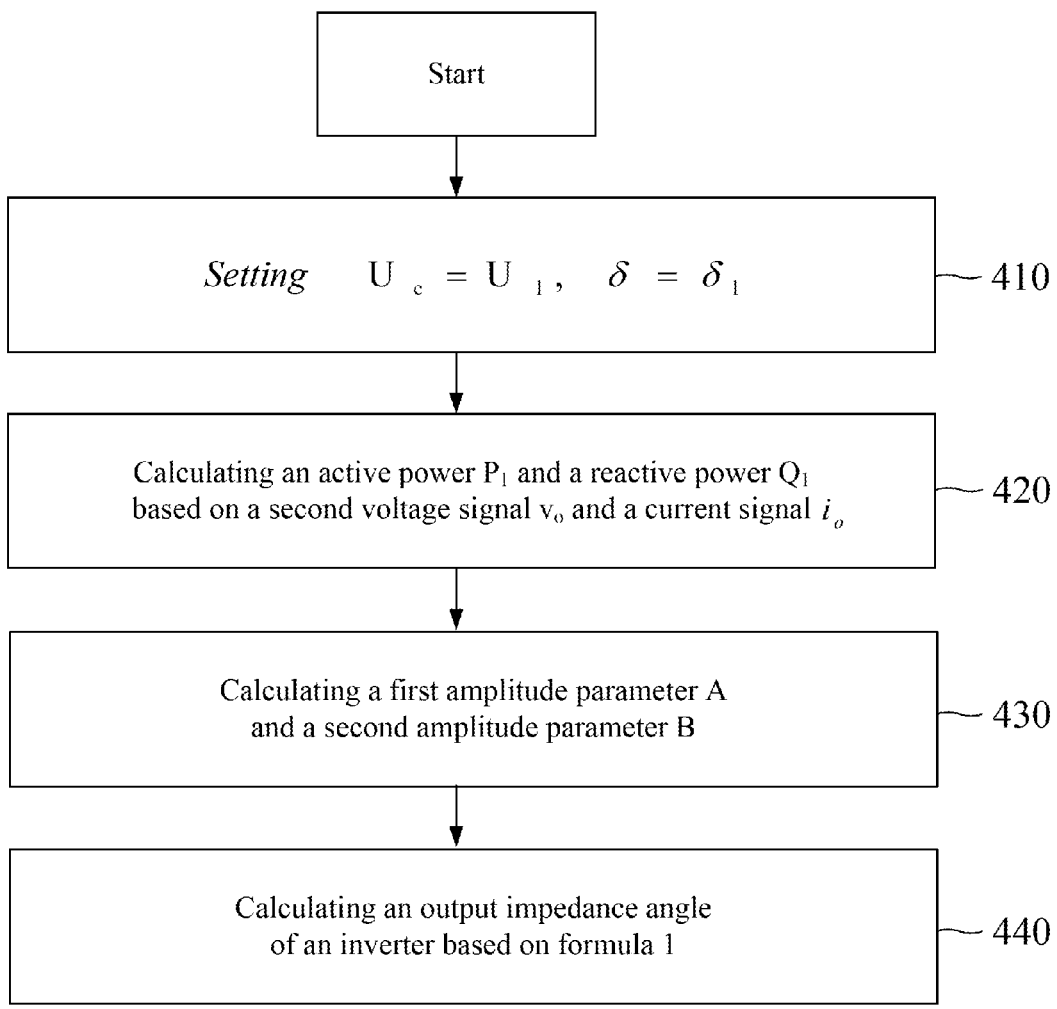
FIG. 4 is a flow diagram illustrating the process steps of a detecting method for detecting an output impedance angle of an inverter according to embodiments of the present disclosure.

For facilitating understanding of operations of the detecting device 100A for detecting an output impedance angle of an inverter of the present disclosure, reference is now made to both FIG. 3 and FIG. 4. FIG. 4 is a flow diagram illustrating the process steps of a detecting method 400 for detecting an output impedance angle of an inverter according to embodiments of the present disclosure. With reference to the figures, in step 410, the voltage signal setting unit 140 can be used to set the first amplitude $U_c$ of the first voltage signal and the power angle δ. For example, the first amplitude $U_c$ can be set to be $U_1$, and the power angle δ can be set to be $\delta_1$. In step 420, the PQ calculation unit 120 can be used to receive the second voltage signal $v_o$ and the current signal $i_0$, and based on the second voltage signal $v_o$ and the current signal $i_0$, to calculate and subsequently output the active power $P_1$ and the reactive power $Q_1$. In step 430, the impedance angle calculation unit 130 can be used to calculate the first amplitude parameter A and the second amplitude parameter B based on the foregoing formulas 2 and 3. In step 440, the impedance angle calculation unit 130 can be used to calculate the output impedance angle θ of the inverter 1500 based on the formula 1. In one embodiment, for obtaining an output impedance angle θ of the inverter accurately, first amplitudes $U_1$ and power angles $\delta_1$ with multi groups of different parameters can be obtained to calculate output impedance angles θ of the inverter. For example, first amplitudes $U_1$ and power angles $\delta_1$ with five groups of parameters can be obtained to calculate five output impedance angles θ of the inverter. Subsequently, an average value of the output impedance angles θ of the inverter is calculated to obtain a final output impedance angle θ of the inverter.

Figure 5:
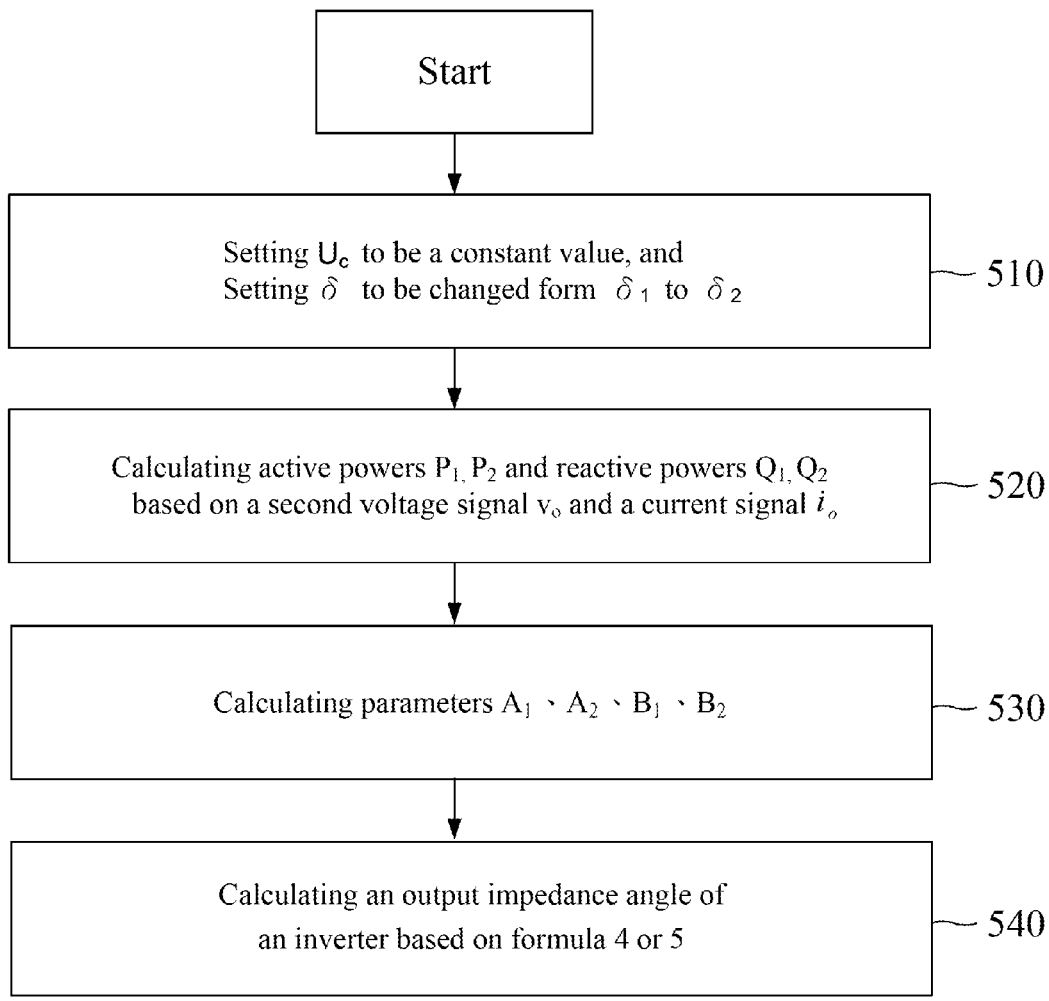
FIG. 5 is a flow diagram illustrating the process steps of a detecting method for detecting an output impedance angle of an inverter according to embodiments of the present disclosure.

For facilitating understanding of operations of the detecting device 100A for detecting an output impedance angle of an inverter of FIG. 3 of the present disclosure, reference is now made to both FIG. 3 and FIG. 5. FIG. 5 is a flow diagram illustrating the process steps of a detecting method 500 for detecting an output impedance angle of an inverter according to embodiments of the present disclosure. With reference to the figures, in step 510, the voltage signal setting unit 140 can be used to set the first amplitude $U_c$ of the first voltage signal to be a constant value, and set the power angle δ to change from the first power angle $\delta_1$ to the second power angle $\delta_2$. In step 520, the PQ calculation unit 120 can be used to receive the second voltage signal $v_o$ and the current signal $i_0$, and based on the second voltage signal $v_o$ and the current signal $i_0$, to calculate and output the first active power $P_1$, the second active power $P_2$, the first reactive power $Q_1$, and the second reactive power $Q_2$.

In steps 530 and 540, as to calculation logic, the impedance angle calculation unit 130 can be used to calculate the output impedance angle θ of the inverter based on a product of the first active power $P_1$ and the first amplitude parameter, a product of the first active power $P_1$ and the second amplitude parameter, a product of the second active power $P_2$ and the first amplitude parameter, and a product of the second active power $P_2$ and the second amplitude parameter. The first amplitude parameter corresponds to the first amplitude $U_c$ of the first voltage signal, the second amplitude parameter corresponds to the first amplitude $U_c$, and a second amplitude of an AC voltage. In one embodiment, the AC voltage can be provided from an AC source which is coupled to the detecting device 100A in parallel. For example, the AC source can be a power grid or another inverter. In another embodiment, for obtaining an output impedance angle θ of the inverter accurately, $U_c$, $\delta_1$, and $\delta_2$ with multi groups of different parameters can be obtained to calculate output impedance angles θ. For example, $U_c$, $\delta_1$, and $\delta_2$ with five groups of parameters can be obtained to calculate five output impedance angles θ. Subsequently, an average value of the output impedance angles θ is calculated to obtain a final output impedance angle θ.

Yet another embodiment is described with reference made to steps 530 and 540. As to calculation logic, the impedance angle calculation unit 130 can be used to calculate the output impedance angle θ of the inverter based on a product of the first reactive power $Q_1$ and the first amplitude parameter, a product of the first reactive power $Q_1$ and the second amplitude parameter, a product of the second reactive power $Q_2$ and the first amplitude parameter, and a product of the second reactive power $Q_2$ and the second amplitude parameter.

Specifically, as shown in steps 530 and 540, the output impedance angle θ of the inverter 1500 is calculated based on the following formula:

$$\theta = \arctan\frac{P_2 * B_1 - P_1 * B_2}{P_1 * A_2 - P_2 * A_1} \qquad \text{formula 4}$$

In formula 4, θ is the output impedance angle, $P_1$ is the first active power, and $P_2$ is the second active power. The first amplitude parameter comprises the first parameter $A_1$ and the second parameter $A_2$, and the second amplitude parameter comprises the third parameter $B_1$ and the fourth parameter $B_2$. The first active power and the first reactive power are calculation values when the first amplitude of the first voltage signal is $U_c$, and the power angle δ is the first power angle $\delta_1$; the second active power and the second reactive power are calculation values when the first amplitude of the first voltage signal is $U_c$, and the power angle δ is the second power angle $\delta_2$.

In another embodiment, as shown in steps 530 and 540, the output impedance angle θ of the inverter 1500 is calculated based on the following formula:

$$\theta = \arctan\frac{Q_1 * A_2 - Q_2 * A_1}{Q_1 * B_2 - Q_2 * B_1} \qquad \text{formula 5}$$

In formula 5, θ is the output impedance angle, $Q_1$ is the first reactive power, and $Q_2$ is the second reactive power. The first amplitude parameter comprises the first parameter $A_1$ and the second parameter $A_2$, and the second amplitude parameter comprises the third parameter $B_1$ and the fourth parameter $B_2$. The first active power and the first reactive power are calculation values when the first amplitude of the first voltage signal is $U_c$, and the power angle δ is the first power angle $\delta_1$. Moreover, the second active power and the second reactive power are calculation values when the first amplitude of the first voltage signal is $U_c$, and the power angle δ is the second power angle $\delta_2$.

In yet another embodiment, the first parameter $A_1$, the second parameter $A_2$, the third parameter $B_1$ and the fourth parameter $B_2$ are respectively obtained by the following formulas:

$$A_1 = U_c \sin \delta \qquad \text{formula 6}$$

$$A_2 = U_c \sin \delta \qquad \text{formula 7}$$

$$B_1 = U_c \cos \delta_1 - U_o \qquad \text{formula 8}$$

$$B_2 = U_c \cos \delta_2 - U_o \qquad \text{formula 9}$$

In the foregoing formulas, $A_1$ is the first parameter, $A_2$ is the second parameter, $B_1$ is the third parameter, $B_2$ is the fourth parameter, $U_c$ is the first amplitude, $\delta_1$ is the first power angle, $\delta_2$ is the second power angle, and $U_0$ is the second amplitude.

Figure 6:
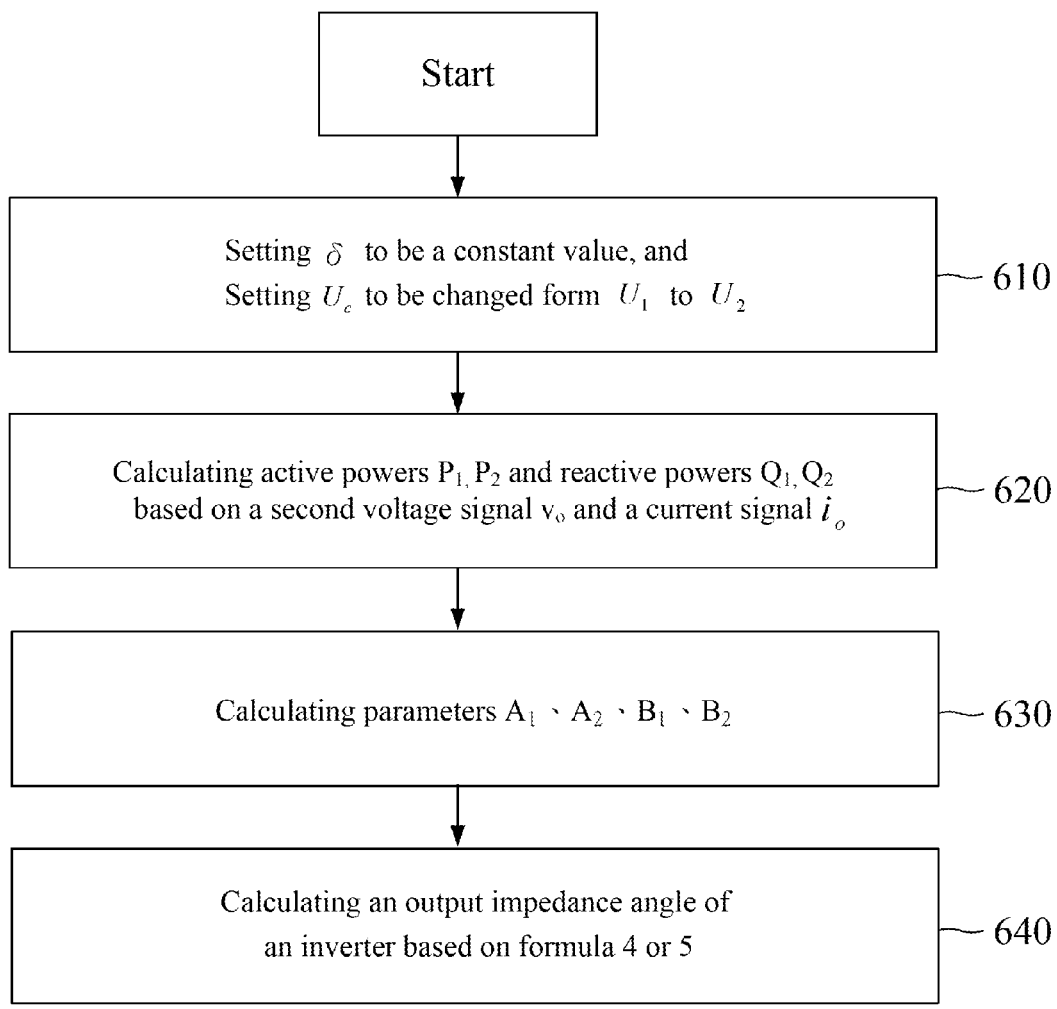
FIG. 6 is a flow diagram illustrating the process steps of a detecting method for detecting an output impedance angle of an inverter according to embodiments of the present disclosure.

For facilitating understanding of operations of the detecting device 100A for detecting an output impedance angle of an inverter of FIG. 3 of the present disclosure, reference is now made to both FIG. 3 and FIG. 6. FIG. 6 is a flow diagram illustrating the process steps of a detecting method 600 for detecting an output impedance angle of an inverter according to embodiments of the present disclosure. With reference to the figures, in step 610, the voltage signal setting unit 140 can be used to set the power angle δ to be a constant value, and set the first amplitude $U_c$ of the first voltage signal to change from a first value $U_1$ to a second value $U_2$. In step 620, the PQ calculation unit 120 can be used to receive the second voltage signal $v_o$ and the current signal $i_0$, and based on the second voltage signal $v_o$ and the current signal $i_0$, to calculate and output the first active power $P_1$, the second active power $P_2$, the first reactive power $Q_1$, and the second reactive power $Q_2$. The first active power and the first reactive power is calculation values when the first amplitude of the first voltage signal is a first value $U_1$, and the power angle is δ. Moreover, the second active power and the second reactive power is calculation values when the first amplitude of the first voltage signal is a second value $U_2$, and the power angle is δ.

In step 630, the impedance angle calculation unit 130 can be used to calculate the first parameter $A_1$, the second parameter $A_2$, the third parameter $B_1$, and the fourth parameter $B_2$ based on the following formulas 10~13:

$$A_1 = U_1 \sin \delta \qquad \text{formula 10}$$

$$A_2 = U_2 \sin \delta \qquad \text{formula 11}$$

$$B_1 = U_1 \cos \delta - U_o \qquad \text{formula 12}$$

$$B_2 = U_2 \cos \delta - U_o \qquad \text{formula 13}$$

In step 640, the impedance angle calculation unit 130 can be used to calculate the output impedance angle θ of the inverter 1500 based on the foregoing formulas 4 or 5. In one embodiment, for obtaining an output impedance angle θ accurately, $U_1$, $U_2$, and δ with multi groups of different parameters can be obtained to calculate output impedance angles θ. For example, $U_1$, $U_2$, and δ with five groups of parameters can be obtained to calculate five output impedance angles θ. Subsequently, an average value of the output impedance angles θ is calculated to obtain a final output impedance angle θ.

Figure 7:
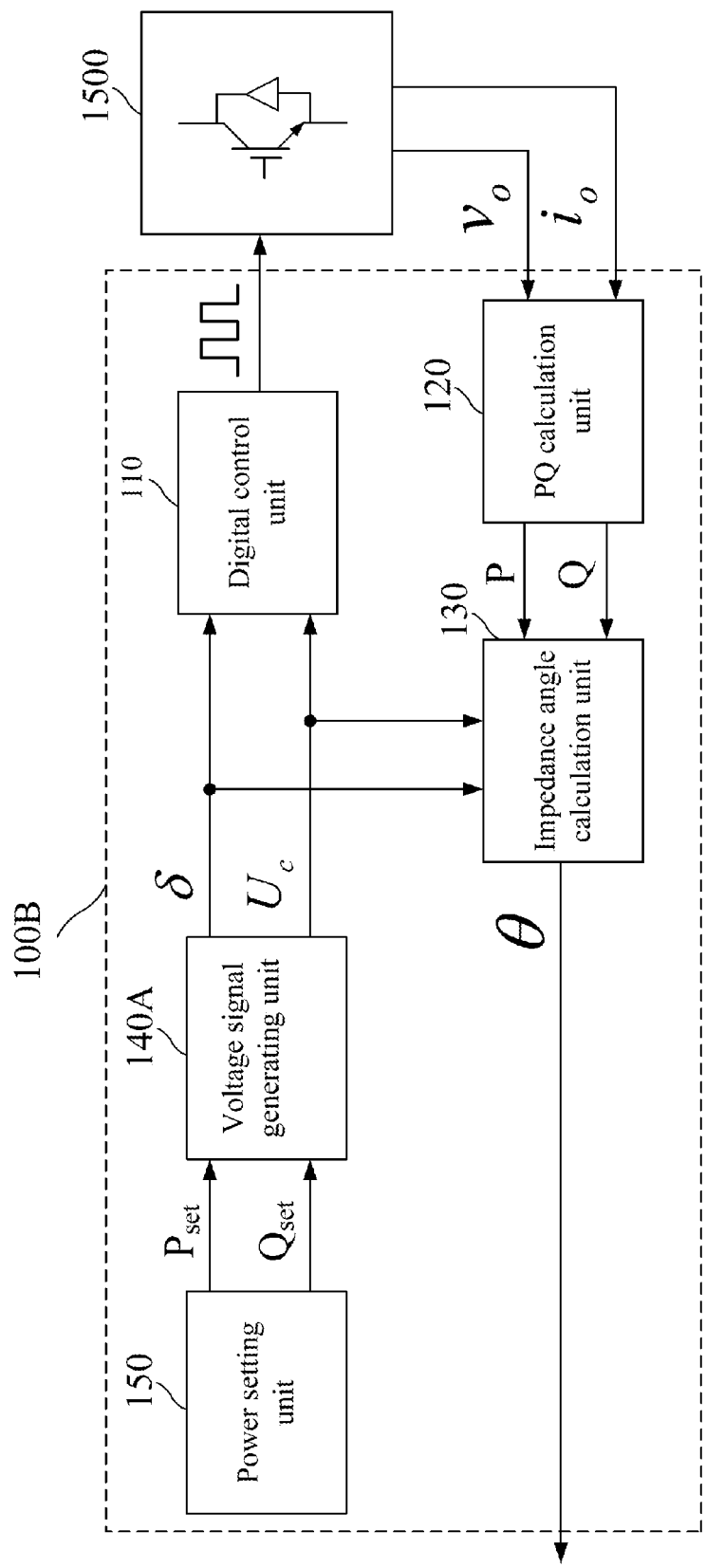
FIG. 7 is a schematic diagram of a detecting device for detecting an output impedance angle of an inverter according to embodiments of the present disclosure.
Figure 8:
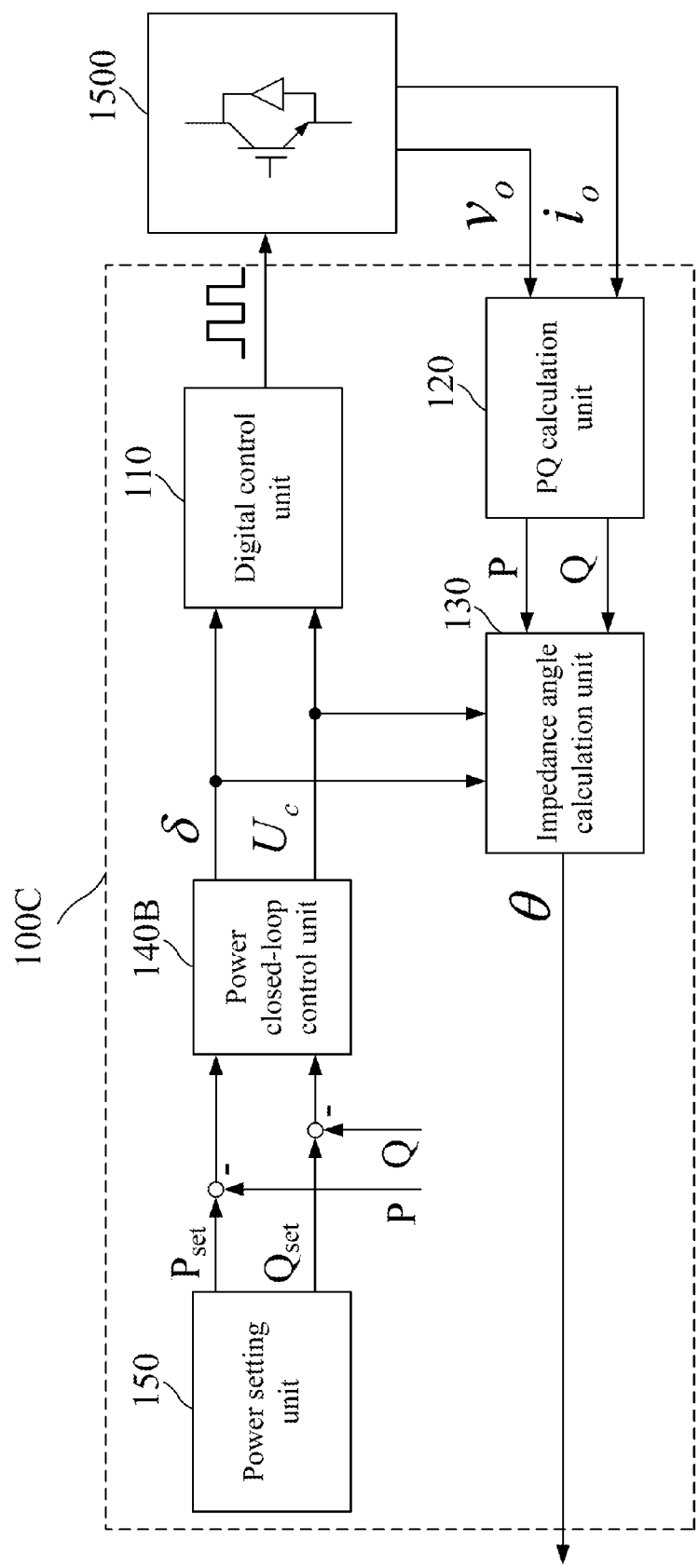
FIG. 8 is a schematic diagram of a detecting device for detecting an output impedance angle of an inverter according to embodiments of the present disclosure.

FIG. 7 is a schematic diagram of a detecting device for detecting an output impedance angle of an inverter according to embodiments of the present disclosure. As shown in the figure, compared with the detecting device 100 in FIG. 1, the detecting device 100B herein further comprises a voltage signal generating unit 140A and a power setting unit 150. FIG. 8 is a schematic diagram of a detecting device for detecting an output impedance angle of an inverter according to embodiments of the present disclosure. As shown in the figure, compared with the detecting device 100 in FIG. 1, the detecting device 100C herein further comprises a power closed-loop control unit 140B and a power setting unit 150.

Figure 9:
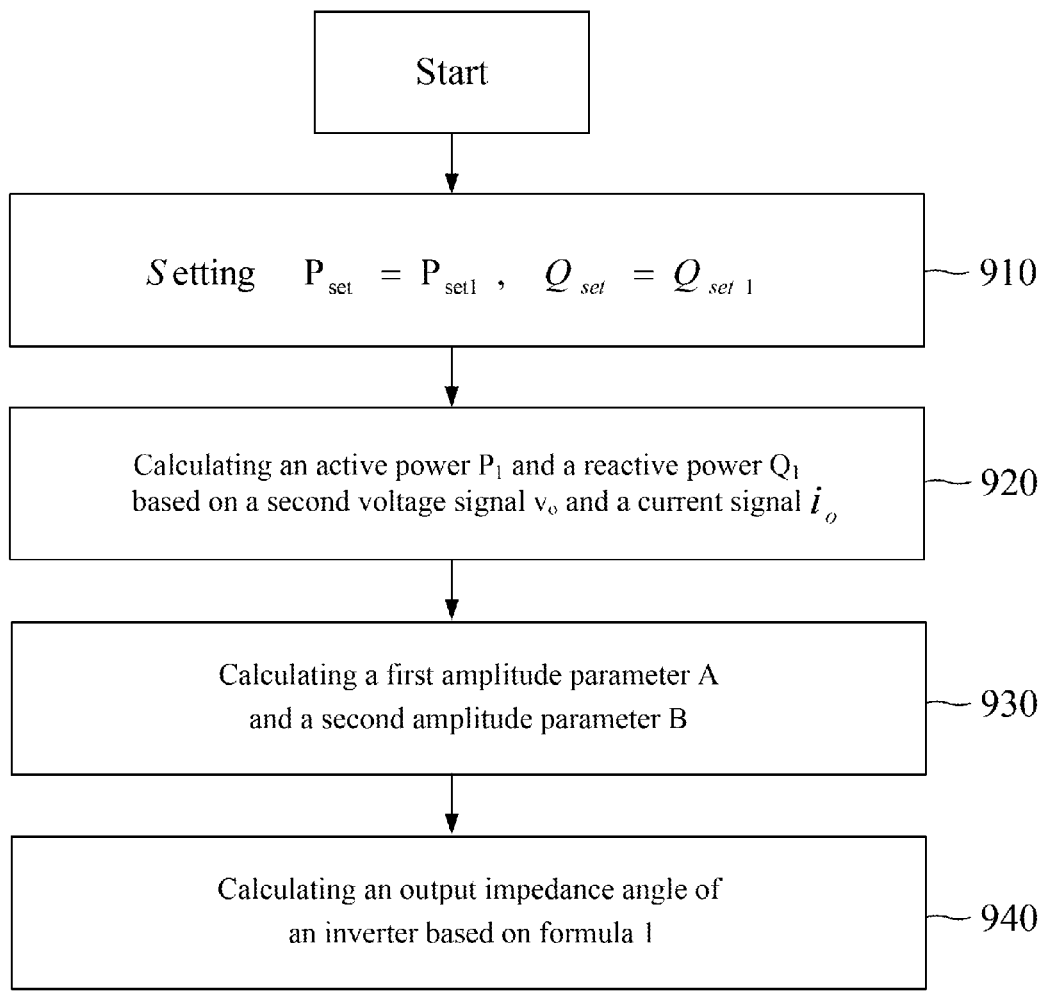
FIG. 9 is a flow diagram illustrating the process steps of a detecting method for detecting an output impedance angle of an inverter according to embodiments of the present disclosure.

For facilitating understanding of operations of the detecting devices 100B, 100C for detecting an output impedance angle of an inverter of FIGS. 7 and 8 of the present disclosure, reference is now made to FIGS. 7, 8, and 9. FIG. 9 is a flow diagram illustrating the process steps of a detecting method 900 for detecting an output impedance angle of an inverter according to embodiments of the present disclosure. With reference to the figures, in step 910, the power setting unit 150 can be used to set the active power signal $P_{set}$ to be $P_{set1}$, and set the reactive power signal $Q_{set}$ to be $Q_{set1}$. The difference between the detecting devices 100B, 100C of FIGS. 7 and 8 relates to the manner in which the first voltage signal is generated. Specifically, the first voltage signal of the detecting device 100B of FIG. 7 can be generated by the power setting unit 150 setting the active power signal $P_{set}$ and the reactive power signal $Q_{set}$, and the voltage signal generating unit 140A generating and outputting the first voltage signal. The first voltage signal of the detecting device 100C of FIG. 8 can be generated by the power setting unit 150 setting the active power signal $P_{set}$ and the reactive power signal $Q_{set}$, and the power closed-loop control unit 140B generating and outputting the first voltage signal.

In step 920, the PQ calculation unit 120 can be used to receive the second voltage signal $v_o$ and the current signal $i_0$, and based on the second voltage signal $v_o$ and the current signal $i_0$, to calculate and output the active power $P_1$ and the reactive power $Q_1$. In step 930, the impedance angle calculation unit 130 can be used to calculate the first amplitude parameter A and the second amplitude parameter B based on the foregoing formulas 2 and 3. In step 940, the impedance angle calculation unit 130 can be used to calculate the output impedance angle $\theta$ of the inverter 1500 based on the foregoing formula 1. In one embodiment, for obtaining an output impedance angle $\theta$ of the inverter accurately, $P_{set1}$ and $Q_{set1}$ with multi groups of different parameters can be obtained to calculate output impedance angles $\theta$. For example, $P_{set1}$ and $Q_{set1}$ with five groups of parameters can be obtained to calculate five output impedance angles $\theta$. Subsequently, an average value of the output impedance angles $\theta$ is calculated to obtain a final output impedance angle $\theta$.

Figure 10:
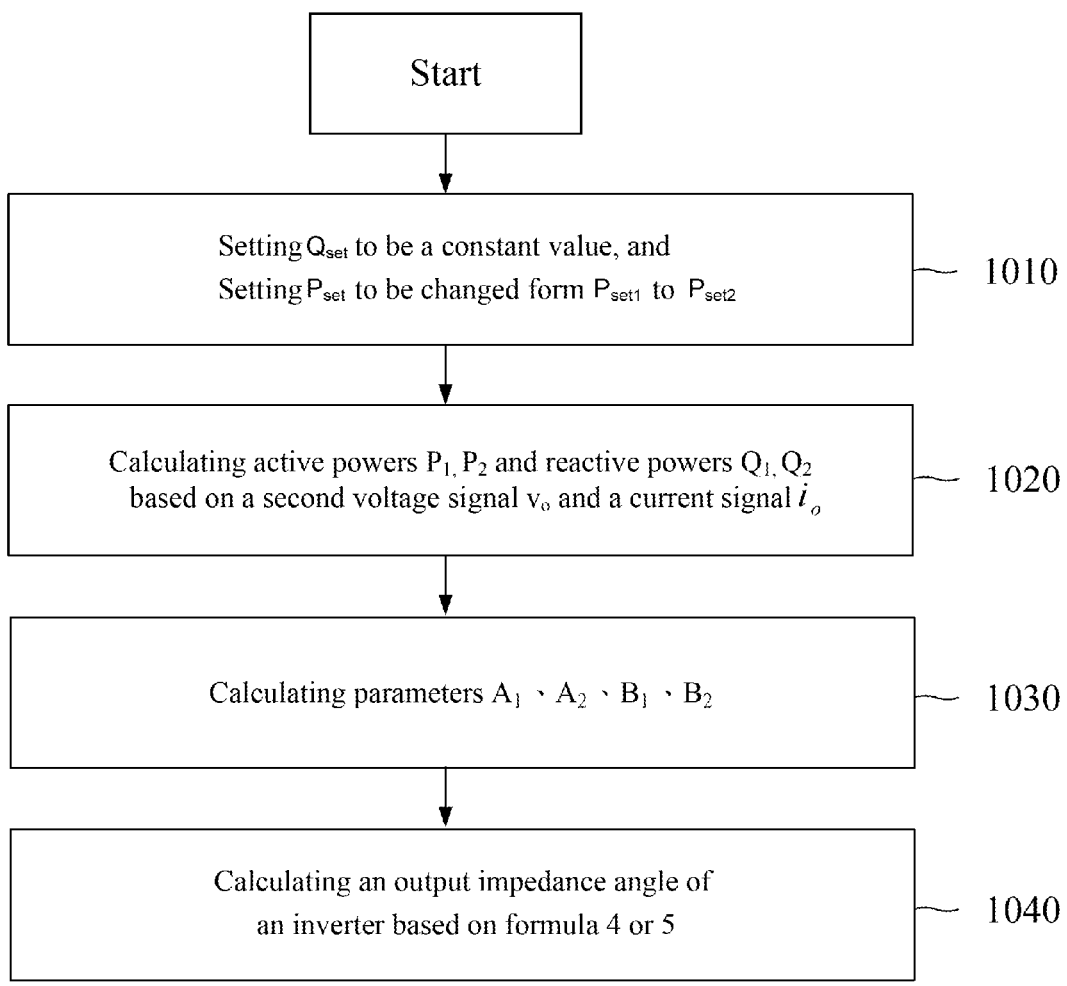
FIG. 10 is a flow diagram illustrating the process steps of a detecting method for detecting an output impedance angle of an inverter according to embodiments of the present disclosure.

For facilitating understanding of operations of the detecting devices 100B, 100C for detecting an output impedance angle of an inverter of FIGS. 7 and 8 of the present disclosure, reference is now made to FIGS. 7, 8, and 10. FIG. 10 is a flow diagram illustrating the process steps of a detecting method 1000 for detecting an output impedance angle of an inverter according to embodiments of the present disclosure. With reference to the figures, in step 1010, the power setting unit 150 can be used to set the reactive power signal $Q_{set}$ to be a constant value, and set the active power signal $P_{set}$ to be changed from $P_{set1}$ to $P_{set2}$. The active power signal $P_{set}$ can be a step signal or a ramp signal. In step 1020, the PQ calculation unit 120 can be used to receive the second voltage signal $v_o$ and the current signal $i_0$, and based on the second voltage signal $v_o$ and the current signal $i_0$, to calculate and output the first active power $P_1$, the second active power $P_2$, the first reactive power $Q_1$, and the second reactive power $Q_2$. If the reactive power signal is $Q_{set}$ and the active power signal is $P_{set1}$, the first amplitude of the first voltage signal is $U_1$, the power angle is $\delta_1$, and the first active power and the first reactive power is a calculation value at this time. If the reactive power signal is $Q_{set}$ and the active power signal is $P_{set2}$, the first amplitude of the first voltage signal is $U_2$, the power angle is $\delta_2$, and the second active power and the second reactive power is a calculation value at this time.

In step 1030, the impedance angle calculation unit 130 can be used to calculate the first parameter $A_1$, the second parameter $A_2$, the third parameter $B_1$, and the fourth parameter $B_2$ based on the following formulas 14~17:

$$A_1 = U_1 \sin \delta_1 \qquad \text{formula 14}$$

$$A_2 = U_2 \sin \delta_2 \qquad \text{formula 15}$$

$$B_1 = U_1 \cos \delta_1 - U_o \qquad \text{formula 16}$$

$$B_2 = U_2 \cos \delta_2 - U_o \qquad \text{formula 17}$$

In step 1040, the impedance angle calculation unit 130 can be used to calculate the output impedance angle $\theta$ of the inverter 1500 based on the foregoing formulas 4 or 5. In one embodiment, for obtaining an output impedance angle $\theta$ accurately, $Q_{set}$, $P_{set1}$, and $P_{set2}$ with multi groups of different parameters can be obtained to calculate output impedance angles $\theta$. For example, $Q_{set}$, $P_{set1}$, and $P_{set2}$ with five groups of parameters can be obtained to calculate five output impedance angles $\theta$. Subsequently, an average value of the output impedance angles $\theta$ is calculated to obtain a final output impedance angle $\theta$.

Figure 11:
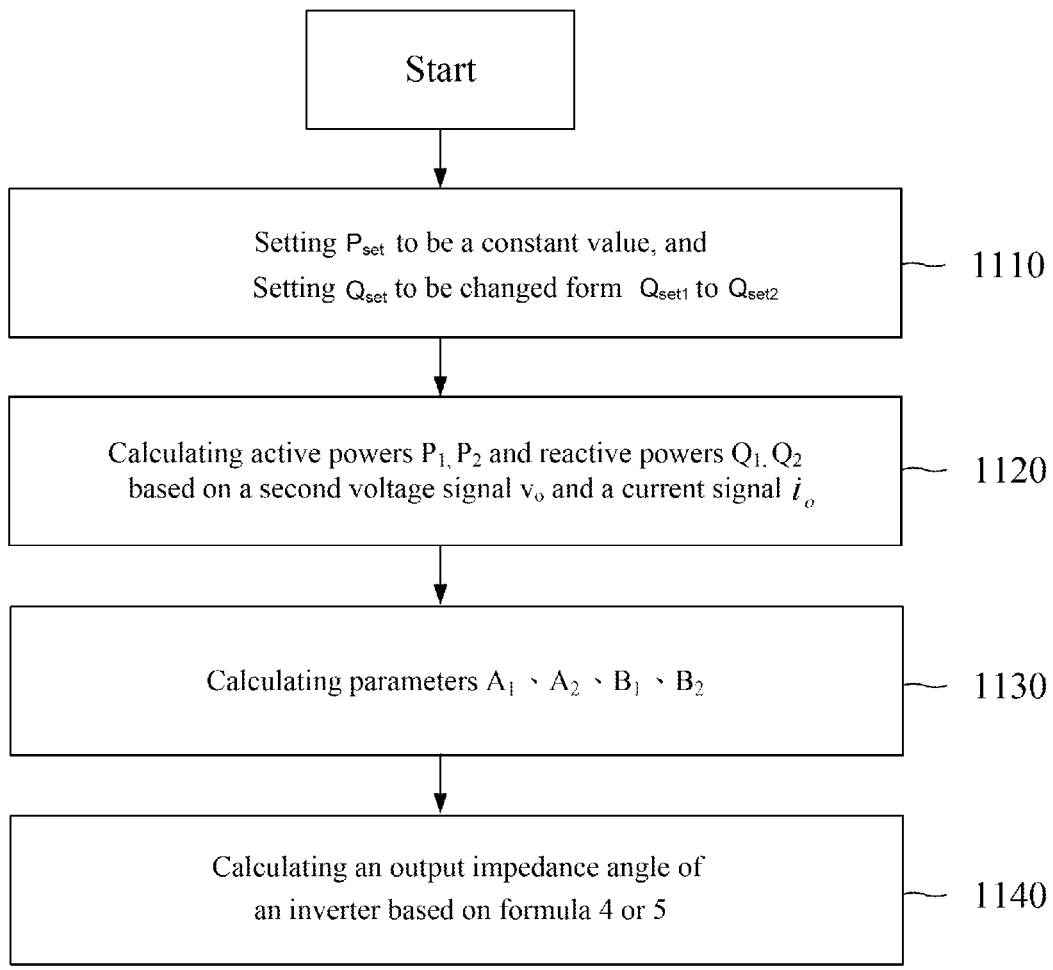
FIG. 11 is a flow diagram illustrating the process steps of a detecting method for detecting an output impedance angle of an inverter according to embodiments of the present disclosure.

For facilitating understanding of operations of the detecting devices 100B, 100C for detecting an output impedance angle of an inverter of FIGS. 7 and 8 of the present disclosure, reference is now made to FIGS. 7, 8, and 11. FIG. 11 is a flow diagram illustrating the process steps of a detecting method 1100 for detecting an output impedance angle of an inverter according to embodiments of the present disclosure. With reference to the figures, in step 1110, the power setting unit 150 can be used to set the active power signal $P_{set}$ to be a constant value, and set the reactive power signal $Q_{set}$ to be changed from $Q_{set1}$ to $Q_{set2}$. The reactive power signal $Q_{set}$ can be a step signal or a ramp signal. In step 1120, the PQ calculation unit 120 can be used to receive the second voltage signal $v_o$ and the current signal $i_0$, and based on the second voltage signal $v_o$ and the current signal $i_0$, to calculate and output the first active power $P_1$, the second active power $P_2$, the first reactive power $Q_1$, and the second reactive power $Q_2$. If the reactive power signal is $Q_{set1}$ and the active power signal is $P_{set}$, the first amplitude of the first voltage signal is $U_1$, the power angle is $\delta_1$, and the first active power and the first reactive power are a calculation value at this time. If the reactive power signal is $Q_{set2}$ and the active power signal is $P_{set}$, the first amplitude of the first voltage signal is $U_2$, the power angle is $\delta_2$, and the second active power and second reactive power are a calculation value at this time.

In step 1130, the impedance angle calculation unit 130 can be used to calculate the first parameter $A_1$, the second parameter $A_2$, the third parameter B1, and the fourth parameter $B_2$ based on the foregoing formulas 14~17. In step 1140, the impedance angle calculation unit 130 can be used to calculate the output impedance angle $\theta$ of the inverter 150 based on the foregoing formulas 4 or 5. In one embodiment, for obtaining an output impedance angle $\theta$ accurately, $P_{set}$, $Q_{set1}$, and $Q_{set2}$ with multi groups of different parameters can be obtained to calculate output impedance angles $\theta$. For example, $P_{set}$, $Q_{set1}$, and $Q_{set2}$ with five groups of parameters can be obtained to calculate five output impedance angles $\theta$. Subsequently, an average value of the output impedance angles $\theta$ is calculated to obtain a final output impedance angle $\theta$.

After detecting the output impedance angle of the inverter by the detecting device and the detecting method provided by the present disclosure, the output impedance angle of the inverter can be used to calculate other impedance parameters, such as $\hat{Z}_o$ (size of an output impedance of the inverter), $\hat{R}$ (size of a resistive impedance value of the output impedance of the inverter), and $\hat{X}$ (size of an inductive impedance value of the output impedance of the inverter), which are obtained by the following formulas 18~21:

First of all, by rearranging $$P = \frac{U_o}{Z_o}(A\sin\theta + B\cos\theta),$$

the following formula can be obtained:

$$\hat{Z}_o = \frac{U_o}{P}(A\sin\theta + B\cos\theta) \qquad \text{formula 18}$$

In the foregoing formulas, P is the active power, $U_O$ is the second amplitude, $Z_O$ is the amplitude of the output impedance of the inverter, A is the first amplitude parameter, B is the second amplitude parameter, and θ is the output impedance angle.

Secondly, by rearranging $$Q = \frac{U_o}{Z_o}(-A\cos\theta + B\sin\theta),$$

the following formula can be obtained:

$$\hat{Z}_0 = \frac{U_o}{Q}(-A\cos\theta + B\sin\theta) \qquad \text{formula 19}$$

In the foregoing formula, Q is the reactive power, $U_O$ is the second amplitude, $Z_O$ is the amplitude of the output impedance of the inverter, A is the first amplitude parameter, B is the second amplitude parameter, and θ is the output impedance angle.

In addition, if $\hat{\theta}$ and $\hat{Z}_o$ are known, the following formulas can be obtained:

$$\hat{R} = \frac{\hat{Z}_o}{\sqrt{1+(\tan\theta)^2}} \qquad \text{formula 20}$$

$$\hat{X} = \frac{\hat{Z}_o * \tan\hat{\theta}}{\sqrt{1+(\tan\theta)^2}} \qquad \text{formula 21}$$

As may be appreciated by persons having ordinary skill in the art, the steps of the detecting method for detecting an output impedance angle of an inverter are named according to the function they perform, and such naming is provided to facilitate the understanding of the present disclosure but not to limit the steps. Combining the steps into a single step or dividing any one of the steps into multiple steps, or switching any step so as to be a part of another step falls within the scope of the embodiments of the present disclosure.

In view of the above embodiments of the present disclosure, it is apparent that the application of the present disclosure has a number of advantages. The present disclosure provides a detecting device and a detecting method for detecting an output impedance angle of an inverter for automatically detecting output impedance angles of inverters simply and accurately, so as to enable efficient control of inverters.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A detecting method for detecting an output impedance angle of an inverter, comprising:
   controlling an inverter to output a second voltage signal and a current signal based on a first voltage signal;
   calculating an active power and a reactive power based on the second voltage signal and the current signal; and
   calculating an output impedance angle of the inverter based on a product of the active power and a first amplitude parameter, a product of the active power and a second amplitude parameter, a product of the reactive power and the first amplitude parameter, and a product of the reactive power and the second amplitude parameter, wherein the first amplitude parameter corresponds to a first amplitude of the first voltage signal, and the second amplitude parameter corresponds to the first amplitude of the first voltage signal and a second amplitude of an AC voltage.

2. The detecting method of claim 1, wherein a step of calculating the output impedance angle of the inverter comprises:
   calculating the output impedance angle of the inverter based on a formula as follows:

$$\theta = \arctan\frac{P*A + Q*B}{P*B - Q*A},$$

wherein θ is the output impedance angle, P is the active power, Q is the reactive power, A is the first amplitude parameter, and B is the second amplitude parameter.

3. The detecting method of claim 2, wherein the first amplitude parameter is obtained by a formula as follows:

$$A = U_c \sin\delta,$$

wherein $U_c$ is the first amplitude of the first voltage signal, and δ is a power angle of the first voltage signal;
   wherein the second amplitude parameter is obtained by a formula as follows:

$$B = U_c \cos\delta - U_o,$$

where $U_O$ is the second amplitude of the AC voltage.

4. The detecting method of claim 3, further comprising:
   setting the first amplitude and the power angle of the first voltage signal.

5. The detecting method of claim 3, further comprising:
   setting an active power signal and a reactive power signal; and
   generating the first amplitude and the power angle of the first voltage signal based on the active power signal and the reactive power signal.

6. A detecting method for detecting an output impedance angle of an inverter, comprising:
   controlling an inverter to output a second voltage signal and a current signal based on a first voltage signal, wherein the first voltage signal comprises a first amplitude and a power angle, a value of one of the first amplitude and the power angle is variable, and a value of the other one of the first amplitude and the power angle is constant;

calculating a first active power, a second active power, a first reactive power, and a second reactive power based on the second voltage signal and the current signal; and calculating an output impedance angle of the inverter based on a product of the first active power and a first amplitude parameter, a product of the first active power and a second amplitude parameter, a product of the second active power and the first amplitude parameter, and a product of the second active power and the second amplitude parameter, or calculating the output impedance angle of the inverter based on a product of the first reactive power and the first amplitude parameter, a product of the first reactive power and the second amplitude parameter, a product of the second reactive power and the first amplitude parameter, and a product of the second reactive power and the second amplitude parameter, wherein the first amplitude parameter corresponds to the first amplitude of the first voltage signal, and the second amplitude parameter corresponds to the first amplitude of the first voltage signal and a second amplitude of an AC voltage.

7. The detecting method of claim 6, wherein the first amplitude is a constant value, and the power angle changes from a first power angle to a second power angle, wherein a step of calculating the output impedance angle of the inverter comprises:

calculating the output impedance angle of the inverter based on one of formulas as follows:

$$\theta = \arctan\frac{P_2 * B_1 - P_1 * B_2}{P_1 * A_2 - P_2 * A_1}, \text{ or, } \theta = \arctan\frac{Q_1 * A_2 - Q_2 * A_1}{Q_1 * B_2 - Q_2 * B_1}$$

wherein θ is the output impedance angle of the inverter, $P_1$ is the first active power, $P_2$ is the second active power, $Q_1$ is the first reactive power, and $Q_2$ is the second reactive power, wherein the first amplitude parameter comprises a first parameter $A_1$ and a second parameter $A_2$, and the second amplitude parameter comprises a third parameter $B_1$ and a fourth parameter $B_2$.

8. The detecting method of claim 7, wherein the first parameter is obtained by a formula as follows:

$$A_1 = U_c \sin \delta_1,$$

wherein $U_c$ is the first amplitude, and $\delta_1$ is the first power angle;

wherein the second parameter is obtained by a formula as follows:

$$A_2 = U_c \sin \delta_2,$$

wherein $\delta_2$ is the second power angle;

wherein the third parameter is obtained by a formula as follows:

$$B_1 = U_c \cos \delta_1 - U_o,$$

wherein $U_0$ is the second amplitude;

wherein the fourth parameter is obtained by a formula as follows:

$$B_2 = U_c \cos \delta - U_o.$$

9. The detecting method of claim 7, further comprising:
setting the first amplitude of the first voltage signal; and setting the power angle of the first voltage signal to change from the first power angle to the second power angle.

10. The detecting method of claim 7, further comprising:
setting an active power signal to be a constant value;
setting a reactive power signal to change from a first reactive power signal to a second reactive power signal; and generating the first amplitude and the power angle of the first voltage signal based on the active power signal, the first reactive power signal, and the second reactive power signal.

11. The detecting method of claim 7, further comprising:
setting an active power signal to change from a first active power signal to a second active power signal;
setting a reactive power signal to be a constant value; and
generating the first amplitude and the power angle of the first voltage signal based on the first active power signal, the second active power signal, and the reactive power signal.

12. The detecting method of claim 6, wherein the first amplitude changes from a first value to a second value, and the power angle is a constant value, wherein a step of calculating the output impedance angle of the inverter comprises:

calculating the output impedance angle of the inverter based on one of formulas as follows:

$$\theta = \arctan\frac{P_2 * B_1 - P_1 * B_2}{P_1 * A_2 - P_2 * A_1}, \text{ or, } \theta = \arctan\frac{Q_1 * A_2 - Q_2 * A_1}{Q_1 * B_2 - Q_2 * B_1}$$

wherein θ is the output impedance angle of the inverter, $P_1$ is the first active power, $P_2$ is the second active power, $Q_1$ is the first reactive power, and $Q_2$ is the second reactive power, wherein the first amplitude parameter comprises a first parameter $A_1$ and a second parameter $A_2$, and the second amplitude parameter comprises a third parameter $B_1$ and a fourth parameter $B_2$.

13. The detecting method of claim 12, wherein the first parameter is obtained by a formula as follows:

$$A_1 = U_1 \sin \delta,$$

wherein $U_1$ is the first value, and δ is the power angle;
wherein the second parameter is obtained by a formula as follows:

$$A_2 = U_2 \sin \delta,$$

wherein $U_2$ is the second value;
wherein the third parameter is obtained by a formula as follows:

$$B_1 = U_1 \cos \delta - U_o,$$

wherein $U_0$ is the second amplitude;
wherein the fourth parameter is obtained by a formula as follows:

$$B_2 = U_2 \cos \delta - U_o.$$

14. The detecting method of claim 12, further comprising:
setting the first amplitude of the first voltage signal to change from the first value to the second value; and
setting the power angle of the first voltage signal.

15. The detecting method of claim 12, further comprising:
setting an active power signal to be a constant value;

setting a reactive power signal to change from a first reactive power signal to a second reactive power signal; and generating the first amplitude and the power angle of the first voltage signal based on the active power signal, the first reactive power signal, and the second reactive power signal.

16. The detecting method of claim 12, further comprising:
setting an active power signal to change from a first active power signal to a second active power signal;
setting a reactive power signal to be a constant value; and
generating the first amplitude and the power angle of the first voltage signal based on the first active power signal, the second active power signal, and the reactive power signal.

17. The detecting method of claim 6, wherein the first active power and the first reactive power are an active power and a reactive power before value changes, and the second active power and the second reactive power is an active power and a reactive power after value changes.

18. A detecting device for detecting an output impedance angle of an inverter, comprising:
a control unit configured for controlling an inverter to output a second voltage signal and a current signal based on a first voltage signal;
an active power and reactive power calculation unit configured for calculating an active power and a reactive power based on the second voltage signal and the current signal; and
an impedance angle calculation unit configured for calculating an output impedance angle of the inverter based on a product of the active power and a first amplitude parameter, a product of the active power and a second amplitude parameter, a product of the reactive power and the first amplitude parameter, and a product of the reactive power and the second amplitude parameter, wherein the first amplitude parameter corresponds to a first amplitude of the first voltage signal, and the second amplitude parameter corresponds to the first amplitude of the first voltage signal and a second amplitude of an AC voltage.

19. The detecting device of claim 18, wherein the output impedance angle of the inverter is obtained by a formula as follows:

$$\theta = \arctan\frac{P*A + Q*B}{P*B - Q*A},$$

wherein θ is the output impedance angle, P is the active power, Q is the reactive power, A is the first amplitude parameter, and B is the second amplitude parameter.

20. The detecting device of claim 19, wherein the first amplitude parameter is obtained by a formula as follows:

$A = U_c \sin \delta,$ where $U_c$ is the first amplitude of the first voltage signal, and δ is a power angle of the first voltage signal;
wherein the second amplitude parameter is obtained by a formula as follows:

$B = U_c \cos \delta - U_o,$ where $U_0$ is the second amplitude of the AC voltage.

21. The detecting device of claim 20, further comprising:
a voltage signal setting unit configured for setting the first amplitude and the power angle of the first voltage signal.

22. The detecting device of claim 20, further comprising:
a power setting unit configured for setting an active power signal and a reactive power signal; and
a voltage signal generating unit configured for generating the first amplitude and the power angle of the first voltage signal based on the active power signal and the reactive power signal.

23. A detecting device for detecting an output impedance angle of an inverter, comprising:
a control unit configured for controlling an inverter to output a second voltage signal and a current signal based on a first voltage signal, wherein the first voltage signal comprises a first amplitude and a power angle, a value of one of the first amplitude and the power angle is variable, and a value of the other one of the first amplitude and the power angle is constant;
an active power and reactive power calculation unit configured for calculating a first active power, a second active power, a first reactive power, and a second reactive power based on the second voltage signal and the current signal; and
an impedance angle calculation unit configured for calculating an output impedance angle of the inverter based on a product of the first active power and a first amplitude parameter, a product of the first active power and a second amplitude parameter, a product of the second active power and the first amplitude parameter, and a product of the second active power and the second amplitude parameter, or calculating the output impedance angle of the inverter based on a product of the first reactive power and the first amplitude parameter, a product of the first reactive power and the second amplitude parameter, a product of the second reactive power and the first amplitude parameter, and a product of the second reactive power and the second amplitude parameter, wherein the first amplitude parameter corresponds to the first amplitude of the first voltage signal, and the second amplitude parameter corresponds to the first amplitude of the first voltage signal, and a second amplitude of an AC voltage.

24. The detecting device of claim 23, wherein the first amplitude is a constant value, and the power angle changes from a first power angle to a second power angle, wherein the output impedance angle of the inverter is obtained by one of formulas as follows:

$$\theta = \arctan\frac{P_2*B_1 - P_1*B_2}{P_1*A_2 - P_2*A_1}, \text{ or, } \theta = \arctan\frac{Q_1*A_2 - Q_2*A_1}{Q_1*B_2 - Q_2*B_1}$$

wherein θ is the output impedance angle, $P_1$ is the first active power, $P_2$ is the second active power, $Q_1$ is the first reactive power, and $Q_2$ is the second reactive power, wherein the first amplitude parameter comprises a first parameter $A_1$ and a second parameter $A_2$, and the second amplitude parameter comprises a third parameter $B_1$ and a fourth parameter $B_2$.

25. The detecting device of claim 24, wherein the first parameter is obtained by a formula as follows:

$A_1 = U_c \sin \delta_1,$ wherein $U_c$ is the first amplitude, and $\delta_1$ is the first power angle;
wherein the second parameter is obtained by a formula as follows:

$A_2 = U_c \sin \delta_2,$ wherein $\delta_2$ is the second power angle;
wherein the third parameter is obtained by a formula as follows:

$$B_1 = U_c \cos \delta_1 - U_o,$$

wherein $U_0$ is the second amplitude;
wherein the fourth parameter is obtained by a formula as follows:

$$B_2 = U_c \cos \delta_2 - U_o.$$

26. The detecting device of claim 23, wherein the first amplitude changes from a first value to a second value, and the power angle is a constant value, wherein the output impedance angle of the inverter is obtained by one of formulas as follows:

$$\theta = \arctan \frac{P_2 * B_1 - P_1 * B_2}{P_1 * A_2 - P_2 * A_1}, \text{ or, } \theta = \arctan \frac{Q_1 * A_2 - Q_2 * A_1}{Q_1 * B_2 - Q_2 * B_1}$$

wherein $\theta$ is the output impedance angle, $P_1$ is the first active power, $P_2$ is the second active power, $Q_1$ is the first reactive power, and $Q_2$ is the second reactive power, wherein the first amplitude parameter comprises a first parameter $A_1$ and a second parameter $A_2$, and the second amplitude parameter comprises a third parameter $B_1$ and a fourth parameter $B_2$.

27. The detecting device of any of claim 26, wherein the first parameter is obtained by a formula as follows:

$$A_1 = U_1 \sin \delta,$$

wherein $U_1$ is the first value, and $\delta$ is the power angle;
wherein the second parameter is obtained by a formula as follows:

$$A_2 = U_2 \sin \delta,$$

wherein $U_2$ is the second value;
wherein the third parameter is obtained by a formula as follows:

$$B_1 = U_1 \cos \delta - U_o,$$

wherein $U_0$ is the second amplitude;
wherein the fourth parameter is obtained by a formula as follows:

$$B_2 = U_2 \cos \delta - U_o.$$

* * * * *